US008368735B2

(12) United States Patent
Soulliaert et al.

(10) Patent No.: US 8,368,735 B2
(45) Date of Patent: Feb. 5, 2013

(54) LIGHT EMITTING ARRAY FOR PRINTING OR COPYING

(75) Inventors: Eric Soulliaert, Heist-op-den-Berg (BE); Herman Van De Straete, Deurne (BE); Danny Smolders, Zandhoven (BE); Dirk Broddin, HB Terneuzen (NL); Frank Deschuytere, Beveren (BE); Katleen Verberck, legal representative, Heist-op-den-Berg (BE)

(73) Assignee: Xeikon Manufacturing N.V., Lier (BE)

( * ) Notice: Subject to any disclaimer, the term of this patent is extended or adjusted under 35 U.S.C. 154(b) by 770 days.

(21) Appl. No.: 12/208,359

(22) Filed: Sep. 11, 2008

(65) Prior Publication Data

US 2009/0115833 A1   May 7, 2009

(30) Foreign Application Priority Data

Sep. 14, 2007 (EP) .................... 07018148
Sep. 17, 2007 (EP) .................... 07075810

(51) Int. Cl.
  *B41J 2/45* (2006.01)
  *H01L 23/10* (2006.01)
  *H01L 21/00* (2006.01)
(52) U.S. Cl. .................. 347/238; 257/706; 438/122
(58) Field of Classification Search .......... 347/205, 347/238; 438/122; 257/706
  See application file for complete search history.

(56) References Cited

U.S. PATENT DOCUMENTS

| 4,821,051 A | 4/1989 | Hediger |
| 5,177,500 A | 1/1993 | Ng |
| 5,235,347 A | 8/1993 | Lee |
| 5,519,430 A * | 5/1996 | De Cock et al. ............ 347/238 |
| 5,940,113 A | 8/1999 | Wilson |
| 6,559,879 B1 | 5/2003 | Kobayashi et al. |

(Continued)

FOREIGN PATENT DOCUMENTS

| EP | 0 629 507 A1 | 12/1994 |
| EP | 0 629 508 A2 | 12/1994 |

(Continued)

OTHER PUBLICATIONS

Search Report of European Patent Office regarding European Patent Application No. 07075810 7-2209. Apr. 24, 2008.

(Continued)

*Primary Examiner* — Stephen Meier
*Assistant Examiner* — Sarah Al Hashimi
(74) *Attorney, Agent, or Firm* — Bacon & Thomas, PLLC (57) ABSTRACT

A light emitting head for use in copiers or printers, the light emitting head having an illuminated length, e.g. a print width or copy width, and including a rigid carrier structure provided from a bulk material that spans at least the illuminated length of the head, the bulk material having a coefficient of thermal conduction larger than 100 W/mK and a coefficient of thermal expansion; a plurality of blocks of light elements arranged in a longitudinal array, the blocks having a coefficient of thermal expansion, each of the blocks of light elements having a first and a second surface, each of the blocks of light elements including a plurality of light-emitting elements exposed on a first surface on the block, the plurality of blocks being physically attached to the carrier structure by a conductive adhesive at substantially the second surfaces, and wherein the bulk material has a coefficient of thermal expansion that differs from the thermal expansion coefficient of the block material by a maximum of $5*10^{-6}$/K.

32 Claims, 5 Drawing Sheets

U.S. PATENT DOCUMENTS 7,316,470 B2 * 1/2008 Nishi et al. .................... 347/69
7,683,474 B2 * 3/2010 Sidwell ......................... 257/712

FOREIGN PATENT DOCUMENTS

| EP | 0 629 974 A1 | 12/1994 |
| EP | 1 681 728 A1 | 7/2006 |
| JP | 07-068841 A | 3/1995 |
| JP | 08-092681 A | 4/1996 |

OTHER PUBLICATIONS

David R Lide. "Thermal and Physical Properties of Pure Metals". CRC Handbook for Chemistry and Physics, 88$^{th}$ Ed . 2008. XP-002468845, pp. 12-196, 197.

Examination Report of European Patent Office regarding European Patent Application No. 07018148.2, Nov. 13, 2009.

Nobuhito Matsushiro, "Processing Colour Image Information", OKI Technical Review, Issue 194, vol. 72 No. 2, Apr. 2003, pp. 64-67.

Masumi Koizumi et al., "LED Printhead for Use in High-speed, High Image Quality Color Printer", OKI Technical Review 189, Apr. 2002, pp. 38-42.

M. Ogihara et al., "High-Speed 1200 dpi LED Printhead", Proceedings of the Pan Pacific Imaging Conference/Japan Hardcopy 1998, 1998, pp. 257-260.

Japanese Office Action issued in JP 2008-235180, dated Dec. 4, 2012, and English translation thereof.

* cited by examiner

LIGHT EMITTING ARRAY FOR PRINTING OR COPYING

TECHNICAL FIELD OF THE INVENTION

The present invention relates to a light emitting head, such as a LED array head and a method of making the same, whereby the light emitting head, such as the LED array head is used as a light source for writing an electrostatic latent image on a photoconductive surface such as on a drum in an electrophotographic marking device such as a printer, fax machine or copier. The present invention also relates to applications of light emitting head such as LED array heads to expose photosensitive films or papers as in silver-halide photography, both monochrome and multicolour. As an alternative for LED arrays, arrays of microlasers, such as VCSEL arrays may be used.

BACKGROUND OF THE INVENTION

With a conventional electrophotographic printer, a charging device charges the surface of a photoconductive drum or belt and an exposing unit such as an LED array head writes an electrostatic latent image on the charged surface of the photoconductive drum. Alternatively, arrays of microlasers, such as VCSELs may be used. U.S. Pat. No. 5,940,113 describes a full page VCSEL array for use in a printer.

Figure 1:
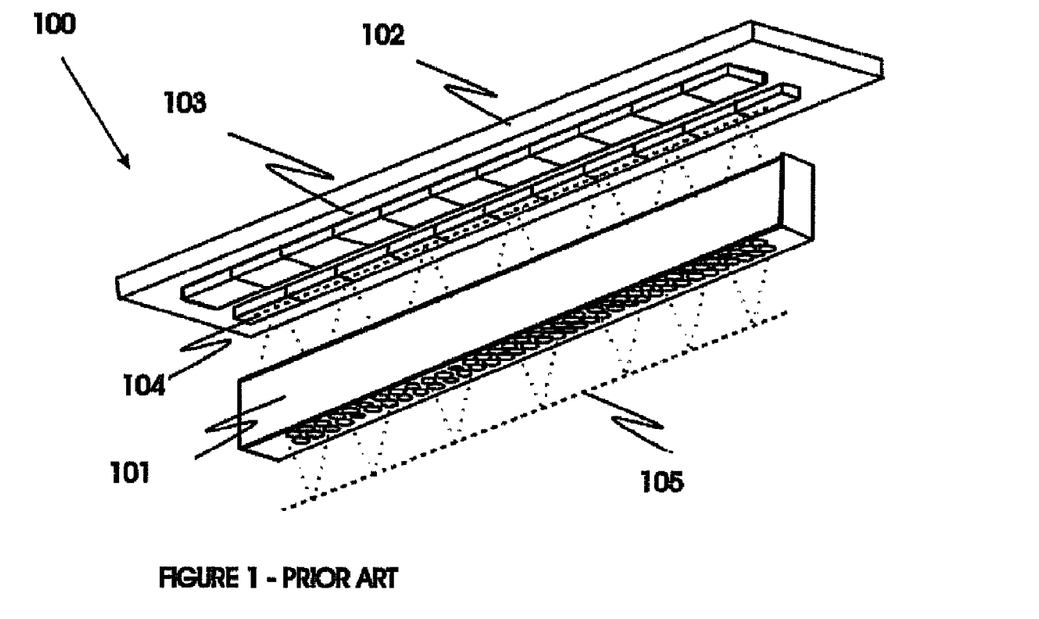
FIG. 1 shows LEDs and Drivers, a wiring substrate with Rod lens optics to project an image of the light emitting regions as known in prior art.

As Shown in FIG. 1, the LED array head 100 comprises a wiring substrate 102 and driver IC's 103 mounted on this wiring substrate. The Driver IC's 103 drive LED array chips 104. The LED array chips emit light through a focusing rod lens array 101 to provide a LED array image 105, and to illuminate the charged surface in accordance with print data. The electrostatic latent image is developed with toner into a toner image, which is subsequently transferred to a print medium. The toner image on the print medium is then fixed by a fixing unit.

In the electrophotographic art, multi-colour printers are known to produce a plurality of colour toner images on a photoconductive drum or endless belt. The obtained toner images are transferred directly onto printing stock material such as a paper sheet or paper web material. In an alternative embodiment the toner images formed on a photoconductive recording member are transferred subsequently to an intermediate belt from distinct image forming stations and are then transferred simultaneously to a receiving sheet or web that eventually is cut into sheets containing a desired printing frame dimension.

The image quality that can be achieved with LED array heads is dependent on a number of factors including the resolution capability, which is determined by the addressability and the optical performance of the focussing rod lens array.

The addressability is typically expressed in terms of a number of pixel elements per unit of length or "dpi" (dots per inch). Along the direction in which the light-emitting elements are aligned on the print head (the X-direction), the addressability number results directly from the packing density of the Light Emitting regions on the LED array chips. The nature of the image data, the timing clocks and the specifics of the LED array head controller may allow to select an imaging mode in which the addressability in the perpendicular Y-direction differs from the addressability in the X direction. The resolution is further determined by the optical performance of the imaging optics that projects a 1:1 image of the Light emitting regions onto the photoconductive drum or belt. Poor optical performance typically results in oversized pixel images that overlap with the neighbouring pixels.

A second important factor determining the image quality level that can be achieved with LED array heads is the presence and the effectiveness of means to control the energy output of the individual pixel elements. Energy output control is required to compensate for inevitable small differences in energy output at the photosensitive medium (including effects of the 1:1 image lens).

Uniformity correction is typically achieved through the use of uniformity look-up tables that adjust the current to the LED's or the pulse length or a combination of both. Various methods for this uniformity control have been described and a preferred method for uniformity control may be found in EP0629974.

High quality systems equipped with uniformity compensation means are suitable for use with image controllers that provide multiple bit image data for each pixel which are then converted to selectable output energy levels for each pixel element.

It is known that the efficiency, i.e. the brightness of the light emission, decreases as the temperature of the LEDs increases. Also the lifetime of the LEDs drops with rising temperature. The decrease in brightness affects the imaging quality of an LED array exposure device. It is desirable to operate LED exposure devices at a temperature not surpassing 40° C., optionally at a temperature in the range of 250 to 35° C. For reliable pixel-wise imaging it is necessary that there is no substantial temperature difference or temperature gradient between the individual LEDs, as is e.g. in U.S. Pat. No. 5,177,500.

In the absence of effective means to reduce the temperature differences or gradients across the width of the print on the other hand, certain groups of pixels of the LED array may heat more than others as a result of recurring image data from repetitive print jobs, such as mailings with a given page layout. U.S. Pat. No. 5,177,500 describes the use of thermal shunts to reduce temperature gradients due to these effects.

According to one method to reduce effects induced by non-uniform heating uses LED arrays mounted on a thermally conductive carrier bar connected to a heat sink. The heat sink may comprise a metal panel provided with metal fins and for more extensive cooling, e.g. forced air-circulation, can be added EP 0629508 describes an improved LED array head where the heat sink is provided. The duct extends between a fluid inlet and a fluid outlet and has a cooling fluid such as water flowing there through. This cooling fluid can be temperature controlled by heating and cooling devices along the circulation path as to achieve a preset temperature for that cooling fluid.

Rather than providing bulky temperature control systems, compact lightweight LED array printer designs typically attempt to limit the heat generation. Improving the efficiency of the LED helps in that respect. A change from AlGaP technology to solid phase diffusion AlGaAs technology was reported to decrease LED-heating substantially in Proceedings of IS&T NIP14 p 405-408 (1998). Heat generation can additionally be reduced—at the expense of exposure power— by shortening pulse-times in matrix addressing techniques. Matrix addressing schemes with 8×8 wiring reduce the maximum duty cycle available by a factor 8. In the compact LED print heads for desktop printers the LED array chips are typically mounted on glass epoxy based circuit boards. Such boards are known to have very poor heat conductivity and there is no significant thermal conduction across the substrate in the sense of a heat sink as described above.

Digital colour printing using LED array technology started in 1994 with a 600 dpi LED array technology providing multi-level per pixel control up to 6 bit per pixel. These LED array technology based printing systems are used for digital printing in high capacity/high volume applications. Systems like the Xeikon 5000 digital printing press implement temperature control and comprise a metallic carrier structure thermoconductively coupled to a heat sink to flatten out temperature differences across the width of the print head Existing 1200 dpi LED array head solutions including reported work on progress in this area fail at present to provide satisfactory solutions to control the temperature of the LED array head to the level required for high volume/high capacity applications as on a digital printing press.

One challenge for the design of a page wide LED array head of increased addressability is the precise positioning and alignment of the plurality of LED array chips on the wiring substrate. Each of said LED array chips has a plurality of light-emitting elements aligned and exposed on an upper surface thereof and consecutive LED array chips are to be aligned on said intermediate carrier bar in a direction in which said light-emitting elements are aligned with equal intervals.

Figure 2:
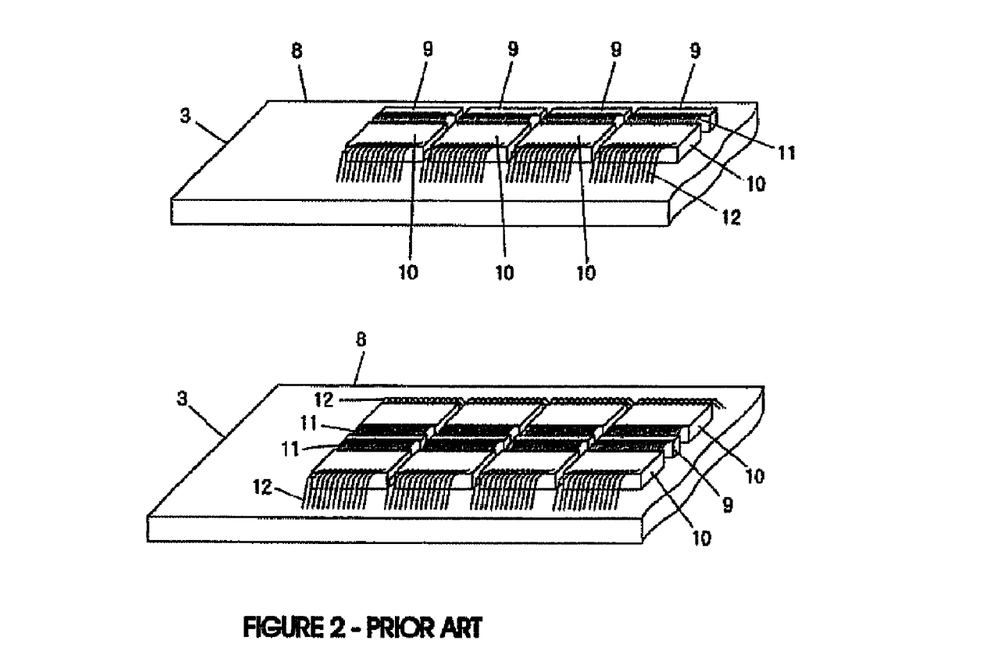
FIG. 2 represents images from U.S. Pat. No. 6,559,879, which show typical configuration of LED array chips and driver chips as known in the art.

FIG. 2 represent images from U.S. Pat. No. 6,559,879, that shows a typical configuration as known form prior art. LED array chips (9) and driver chips (10) are arranged on a wiring substrate (8), with wire bonds (11) for providing electrical current to each individual light emitting diode. In FIG. 2A driver chips (10) are provided on one side and in FIG. 2B driver chips (10) are provided on two sides of the row of LED array chips (9).

Figure 3:
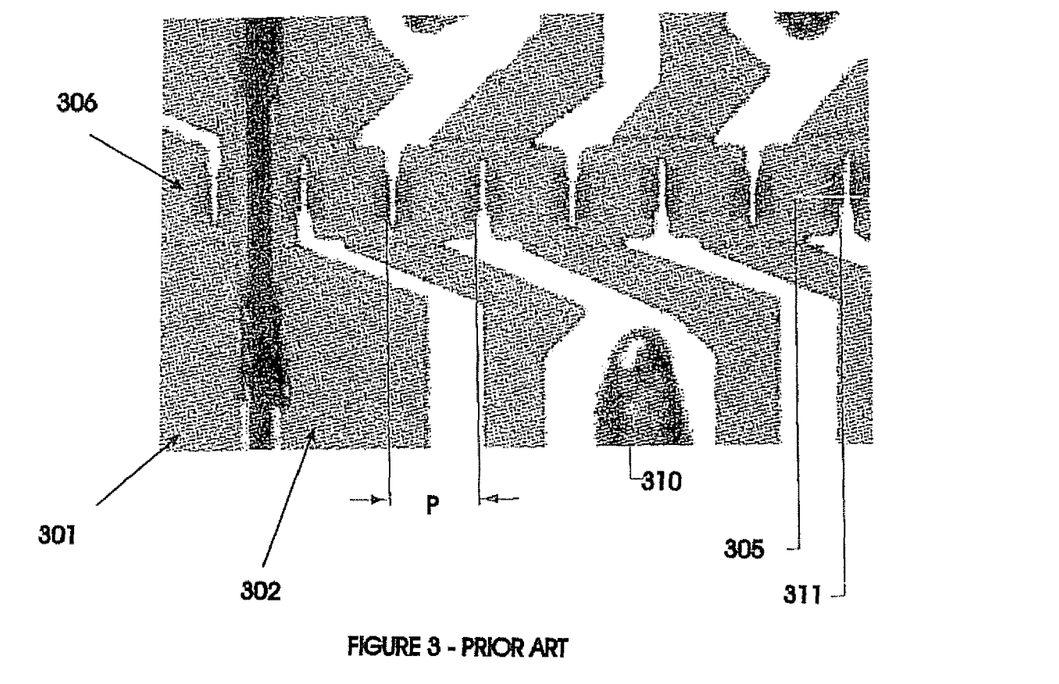
FIG. 3 shows a microscopic view of the join of two LED chips as known in the art.

FIG. 3 shows the arrangement of two LED array chips 301 and 302 of a 600 dpi LED array head from OCE Printing Systems as published in "Handbook of Print Media" by H. Kipphan (Springer ISBN 3-540-67326-1 2001 p 694).

Figure 4:
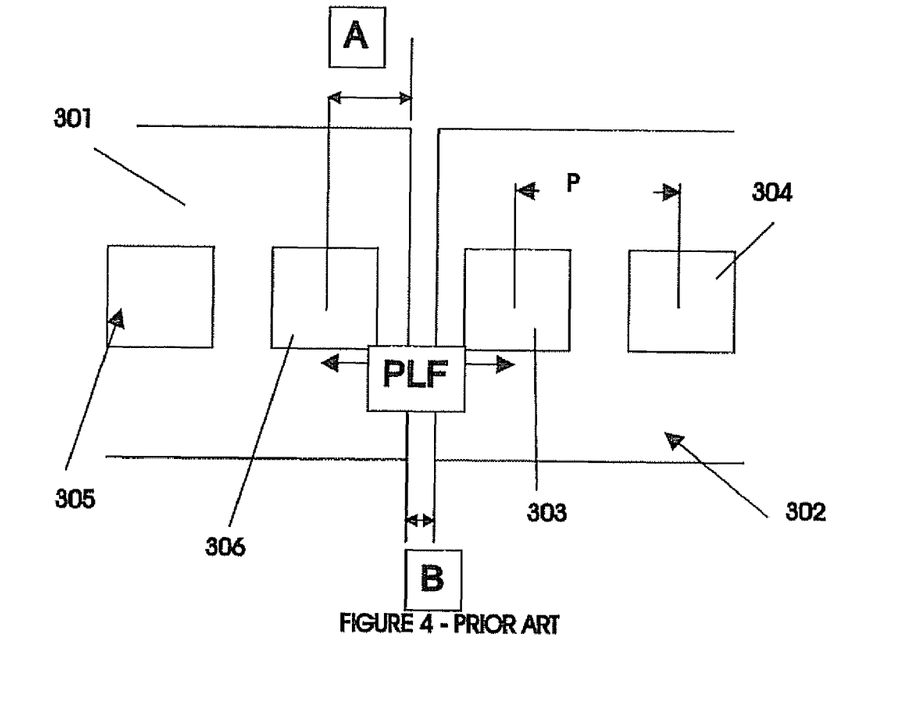
FIG. 4 is a schematic representation of the join of two LED chips as shown in FIG. 3.

FIG. 4 schematically introduces positional parameters A and B into the arrangement as shown in FIG. 3. Distance (A) between the centre of the first or last light emitting area on the LED array chip and the LED array chip edge is usually about 16 microns. Gap B in between the LED array chips is usually about 10 micron. Bond pads for wire bonding are provided in an alternating fashion on either side of the LED array chip in a configuration with two drivers per LED array chip as in FIG. 2B. In this device, there are 128 light emitting elements per chip resulting in a chip length of about 5 mm.

U.S. Pat. No. 4,821,051 discusses aspects of thermal expansion differences between LEDs and the wiring substrate. The wiring substrate is comprised out of small tiles made out of steel.

U.S. Pat. No. 6,559,879 discusses thermal expansion and shrinking effects due to manufacturing steps and proposes the use of LED array chips bonded to a glass epoxy circuit board by an epoxy resin type soft adhesive.

The bonding of the LED array chips with a thin layer of a stiff adhesive is known to result in stress on the LED array chips as a result of a change in temperature when the CTE of the chips and the CTE of the wiring substrate differ. The use of a thicker layer of soft adhesive relieves such stresses. This has the effect however that shrinkage stress in the sense as discussed in U.S. Pat. No. 6,559,879 vanishes almost completely.

The gap B changes when changing temperature. The gap B, in absolute figures, is determined by the length of the chip and the difference CTE between the wiring substrate and the LED array chips.

The LED array chips 301 and 302 have light emitting regions 305. The PLF (pitch-last-first), which represents the distance between the centre of the rightmost light emitting region 306 of the left chip and centre of the leftmost light emitting region of the right chip is preferably exactly the same as the intended pitch P, measured between two adjacent LEDs 303 and 304 of the same LED array chip. In this embodiment, the Pitch P is 423 µm. in FIG. 3, further a bonding wire 310 is shown, and the location 311 where the light emitting area is bond.

For light emitting diodes at the ends of adjacent chips to be spaced at an interval matching the printing pitch, the chips have to be diced at positions very close to the light emitting cells, and no cracks or other defects can be allowed within the chip, (see OKI Technical Review April 2003/Issue 194 Vol. 70 No. 2—available from http://www.oki.com). Whereas the value A in FIG. 4 ideally would scale with the printing pitch (P), the ratio of A/P typically increases with decreasing printing pitch or increasing addressability. This increase of A/P affects the size of the gap B.

In the case of small gap B of only a few microns, even a moderate temperature decrease may lead to a temperature induced reduction of the gap B to zero leading to a collision between the LED array chips, especially when the length of the chip and the difference CTE between the wiring substrate and the LED array chips are substantial.

Whereas conventional Cu-based wiring substrates can be used at 600 dpi for a LED array chip size of 5 mm where light-emitting elements aligned with equal intervals have a pitch between consecutive light-emitting elements of 42.3 microns, the gap B is reduced to zero when subjected to only a limited temperature reduction. When the pitch between consecutive light-emitting elements is reduced below 35 microns, e.g. as in 800 dpi systems where reasonable LED array chip sizes of more than 4 mm require to pack at least 192 light emitting elements per chip, there is a risk in collision of adjacent LED array chips when the LED array head is subjected to too large temperature reduction, e.g. in case of transporting the LED array head or devices in which the head is integrated by airplane. As an example, such device may be subjected to temperatures of −30° C. during transport, which may damage the LED array heads because of collision of adjacent LED array chips.

SUMMARY OF THE INVENTION

There remains a need for an array of high resolution light emitting elements e.g. LED elements, with a resolution exceeding 600 dpi as well as a method of manufacturing such an array. An advantage of the present invention is that a plurality of blocks of light elements, such as LED array chips, can be aligned on a wiring substrate that has good thermal contact to a temperature controlled heat sink structure, whereby the light emitting head, e.g. LED array head is robust with respect to environmental temperature changes in the operational and/or non-operational state.

It is an object of embodiments of the present invention to provide good light emitting heads, optionally LED array heads, optionally having a high resolution, i.e. comprising blocks of light elements, optionally LED array chips, with a high dpi, such as more than 600 dpi, even more than 800 dpi, e.g. 1200 dpi or more as well as methods of making the same. The array may be used in a copier or a printer or fax machine. It is an advantage of embodiments of the present invention to further improve the image quality of high capacity/high volume digital printing by using a light emitting head, such as e.g. an LED array head technology allowing the transition from 600 dpi multilevel technology to 1200 dpi multilevel technology.

Light emitting heads, optionally LED array heads, according to the present invention accomplishes at least some of the above objective. The array may be suitable for a full-page printhead.

The present invention provides a light emitting head for use in copiers or printers, the light emitting head having an illuminated length, e.g. a print width or copy width, comprising:
  a rigid carrier structure of one piece and provided from a bulk material, said carrier structure spanning at least the illuminated length of the head, said bulk material having a coefficient of thermal conduction larger than 100 W/mK and a coefficient of thermal expansion;
  a plurality of blocks of light elements arranged in a longitudinal array, the blocks having a coefficient of thermal expansion, each of the blocks of light elements having a first and a second surface, each of said blocks of light elements comprising a plurality of light-emitting elements exposed on a first surface on said block, said plurality of blocks being physically and directly attached to said carrier structure by a conductive adhesive at the second surfaces,
  characterized in that
  said bulk material has a coefficient of thermal expansion that differs from the thermal expansion coefficient of the block material by a maximum of $5*10^{-6}$/K.

In another aspect the present invention provides: a light emitting head for use in copiers or printers, the light emitting head having an illuminated length, e.g. a print width or copy width such as for a full-page, comprising:
  a rigid carrier structure provided from a bulk material, said carrier structure spanning at least the illuminated length of the head, said bulk material having a coefficient of thermal conduction larger than 100 W/mK and a coefficient of thermal expansion;
  a plurality of blocks of light elements arranged in a longitudinal array, the blocks having a coefficient of thermal expansion, each of the blocks of light elements having a first and a second surface, each of said blocks of light elements comprising a plurality of light-emitting elements exposed on a first surface on said block, said plurality of blocks being physically attached to said carrier structure by a conductive adhesive at the second surfaces, said bulk material having a coefficient of thermal expansion that differs from the thermal expansion coefficient of the block material by a maximum of $5*10^{-6}$/K, e.g. by $4*10^{-6}$/K; or $<4*10^{-6}$/K, e.g. $<3*10^{-6}$/K such as $1.1*10^{-6}$/K.

Optionally the plurality of blocks may be physically attached to the carrier structure by a conductive adhesive at a substantial part of the second surfaces of the blocks of light elements. Optionally, the adhesive may be applied to the entire or to substantially the entire second surfaces of the blocks of light elements.

In a further aspect the present invention provides: a light emitting head for use in copiers or printers, the light emitting head having an illuminated length, e.g. a print width or copy width, comprising:
  a rigid carrier structure provided from a bulk material, said carrier structure spanning at least the illuminated length of the head, said bulk material having a coefficient of thermal conduction larger than 100 W/mK and a coefficient of thermal expansion;
  a plurality of blocks of light elements arranged in a longitudinal array, the blocks having a coefficient of thermal expansion, each of the blocks of light elements having a first and a second surface, each of said blocks of light elements comprising a plurality of light-emitting elements exposed on a first surface on said block, said plurality of blocks being physically attached to said carrier structure by a conductive adhesive at the second surfaces, the bulk material having a coefficient of thermal expansion that differs from the thermal expansion coefficient of the block material by a maximum of ±30%, e.g. by a maximum of ±25%, such as by a maximum of ±20% or even by a maximum of ±15%, e.g. by a maximum of ±10%, or even by a maximum of ±5%, optionally by a maximum of ±3%.

Optionally the plurality of blocks may be physically attached to the carrier structure by a conductive adhesive at a substantial part of the second surfaces of the blocks of light elements. Optionally, the adhesive may be applied to substantially the entire second surfaces of the blocks of light elements.

In yet another aspect the present invention provides a light emitting head for use in copiers or printers, the light emitting head having an illuminated length, e.g. a print width or copy width, comprising:
  a rigid carrier structure provided from a bulk material, said carrier structure spanning at least the illuminated length of the head, said bulk material having a coefficient of thermal conduction larger than 100 W/mK and a coefficient of thermal expansion,
  a plurality of blocks of light elements arranged in a longitudinal array, the blocks having a coefficient of thermal expansion, each of the blocks of light elements having a first and a second surface, each of said blocks of light elements comprising a plurality of light-emitting elements exposed on a first surface on said block, said plurality of blocks being physically attached to said carrier structure by a conductive adhesive at the second surfaces, said bulk material having a coefficient of thermal expansion that is in the range of $5*10^{-6}$/K to $9*10^{-6}$/K.

Optionally the plurality of blocks may be physically attached to the carrier structure by a conductive adhesive at a substantial part of the second surfaces of the blocks of light elements. Optionally, the adhesive may be applied to substantially the entire second surfaces of the blocks of light elements.

Optionally, the bulk material of a light emitting head according to the first, second or third aspect of the present invention may have a coefficient of thermal expansion that differs from the thermal expansion coefficient of the block material by a maximum of ±25%, such as by a maximum of ±20% or even by a maximum of ±15%, e.g. by a maximum of ±10%, or even by a maximum of ±5%, optionally by a maximum of ±3%. The bulk material may have a coefficient of thermal expansion that differs from the thermal expansion coefficient of the block material by a maximum of $5*10^{-6}$/K, e.g. by $4*10^{-6}$/K, or $<4*10^{-6}$/K, e.g. $<3*10^{-6}$/K such as $1.1*10^{-6}$/K. The bulk material may have a coefficient of thermal expansion that is in the range of $5*10^{-6}$/K to $9*10^{-6}$/K. The blocks of light elements, optionally LED array chips, may include a semiconductor compound having gallium arsenide therein, such as AlGaAs.

The conductive adhesive for physically attaching the carrier structure and the plurality of blocks of light elements, hereafter also referred to as first conductive adhesive, may be a resin-type adhesive, such as an epoxy type resin adhesive.

The first conductive adhesive has in particular thermally conductive properties, optionally also electrically conductive properties. In particular the first conductive adhesives may belong to the class of adhesives called thermally conductive as suitable for heat sinks.

Optionally the light emitting head may be a LED array head, the plurality of blocks of light elements being a plurality of LED array chips.

Alternatively the light emitting head may comprise a plurality of blocks of light elements, the light elements being OLED's or laser diodes such as VCSEL's.

The light emitting head, such as a LED array head, may be for a printhead and has a print width in print width direction. It may be suitable for a full-page print head.

The plurality of blocks of light elements, optionally LED array chips, are aligned on the carrier structure along the longitudinal axis thereof in a direction substantially parallel to the print width.

The first surface may be referred to as the upper surface, the second surface may be referred to as lower surface.

The blocks of light elements may e.g. be die-bonded with extremely high precision to the rigid carrier, at a relatively low rate, such as e.g. bonding one by one, bonding about 66 blocks of light elements and twice as much driver chips per hour. The depth of focus of high modulation transfer 1:1 selfoc arrays is limited to a few tens of microns. It was found that using adhesives that can be used for die-bonding at a temperature close to the operating temperature and that can be cured at a temperature in the range of operating temperatures of the light emitting head, such as less than 40° C., improves the manufacturing precision of the light emitting head.

Optionally the plurality of blocks may be physically attached to the carrier structure by a conductive adhesive at a substantial part of the second surfaces of the blocks of light elements. Optimally the adhesive may be applied to substantially the entire second surfaces of the blocks of light elements.

"Adhesive at a substantial part of the second surface" is to be understood as is adhesive applied at 50% or more of the surface area of the second surface. Optionally, adhesive may be applied at 80% or more of the surface area of the second surface. Substantially the entire is to be understood as would at most only a minor part of the surface area be not covered with adhesive, due to normal production tolerances.

The term "attached" is to be understood as connecting the second, lower surface of the blocks of light elements, optionally a LED array chip, to the carrier structure for securing the two objects one to the other.

Bulk material is to be understood as a material which has a definite composition and properties, and any amount of this material has the same composition and properties. The bulk material may be electrically conductive, having a volume resistivity in the range of $10^{-9}$ Ohm*m to $10^{-5}$ Ohm*m, e.g. $340*10^{-9}$ Ohm*m.

Optionally the blocks of light elements, such as LED array chips, include a semiconductor compound. An example of semiconductor compounds are gallium and arsenide.

For each block of light elements, e.g. a LED array chip, the light-emitting elements may be aligned with substantially equal intervals between adjacent light emitting elements. Optionally, the plurality of blocks of light elements, e.g. LED array chips, are aligned on the carrier structure in a direction in which the light-emitting elements are aligned in each of the blocks of light elements, e.g. LED array chips.

The number of light emitting elements per inch of the block of light element, such as a LED array chip, may vary, but may be 600 elements per inch or more, such as 800 elements per inch (23.6 per mm and 31.5 per mm respectively). The number of light emitting elements per inch of the block of light elements, e.g. a LED array chip, may be 1200 elements per inch or even more (47.25 per mm or more).

The length of the print width in printing width direction of the block of light elements, e.g. a LED array head may vary, but may be in the range of e.g. 200 mm to 1200 mm, more specifically, such as e.g. 270 mm or more, optionally 330 to 640 mm.

The length of the blocks of light elements, e.g. LED array chips, may vary, but may be in the range of e.g. 3 mm to 10 mm, such as 4 mm, 5 mm or 8 mm.

According to some embodiments of the present invention, each of the blocks of light elements may have a common electrode provided on a lower surface of said block of light elements.

Optionally, the plurality of blocks of light elements, e.g. LED array chips, are electrically connected through the common electrodes provided on their lower surfaces to the carrier structure by means of the conductive adhesive which is optionally electrically conductive. The blocks may be alternatively or additionally connected electrically to the carrier structure by metal wires.

According to some embodiments of the present invention, the carrier structure may be a carrier bar. The light emitting head further may comprise a metallic base structure spanning at least the print width of the light emitting head, optionally provided with cooling means. The carrier bar is preferably physically attached to said metallic base support by a flexible layer of a second conductive adhesive, in particular a thermally conductive adhesive.

The layer of second conductive adhesive, in particular thermally conductive adhesive, may have a thickness optionally being more than 100 μm.

The layer of second conductive adhesive, in particular thermally conductive adhesive, may have a thickness in the range of 200 μm to 500 μm.

Optionally the second conductive adhesive may be electrically conductive.

A thermally conductive adhesive for use with the present invention, e.g. either the first or the second conductive adhesive, is to be understood as having a thermal conductivity of more than 0.5 W/mK, such 1.5 W/mK. or 30 W/mK An electrically conductive adhesive, e.g. either the first or the second conductive adhesive, is to be understood as having a volume electrical resistivity of more than $10^{-6}$ Ohm*m, optionally more than $10^{-5}$ Ohm*m, such as $50*10^{-6}$ Ohm*m.

A conductive adhesive, both the first and/or the second conductive adhesive, optionally bi- or multi-component adhesive such as polymer bi- or multi-component adhesives, preferably cures irreversibly at temperatures which are in the range of the working temperatures, i.e. the intended operating temperatures, of the light emitting head being part of the copier or printer, i.e. at temperatures below 40° C. By using adhesives which cure at such temperatures, expansion effects such as distortion or bending of the rigid carrier structure, or distortion or bending of the rigid carrier structure relative to the block of light elements is avoided. This is of importance seen the precision that is necessary in manufacture the light emitting heads for printing or copying applications. Adhesives may be of any suitable type of which silicone-based adhesives, butadiene-based adhesives, bismaleimide-based adhesives and epoxy-based adhesives are only examples.

The layer of second conductive adhesive, in particular thermally conductive adhesive, may be flexible after curing.

The second adhesive may be similar or even identical to the adhesive used to connect the blocks of light elements, e.g. LED array chips, to the carrier structure, being the first conductive adhesive.

According to some embodiments, the second conductive adhesive may have an elasticity modulus being less than the elasticity modulus of the conductive adhesive physically attaching said plurality of blocks to said carrier structure. The second adhesive may be different from the adhesive used to connect the blocks of light elements, e.g. LED array chips, to the carrier structure, being the first conductive adhesive. The first conductive adhesive may have an elasticity modulus higher than the elasticity modulus of the second conductive adhesive. The first conductive adhesive may have an elasticity modulus of more than 1000 MPa, e.g. being an epoxy-type adhesive or an acrylate-based adhesive, whereas the second conductive adhesive, for coupling the base structure and the carrier bar, has optionally a lower elasticity modulus, e.g. an elasticity modulus of less than 10 MPa, such as silicone-based adhesives or butadiene based adhesives, e.g. adhesives having an elasticity modulus of a about 1 Mpa. Optionally the second conductive adhesive is a silicon-based adhesive provided with a layer thickness of 100 to 500 µm thickness.

According to some embodiments of the present invention, the metallic base structure may include a cooling means.

According to some embodiments of the present invention, the cooling means may comprise one or more channels for circulating cooled fluid, e.g. a cooling liquid.

The cooled liquid may be an actively cooled liquid.

According to some embodiments of the present invention, at least one surface of the carrier structure meant for contacting the conductive adhesive may be provided with a coating of a metal selected from the group consisting of silver, gold, platinum, copper, mercury, aluminium, palladium, rhodium, iridium, and osmium, or a combination of metals from this group.

Of these metals noble metals are preferred, because of freedom from oxidation and permanence in air.

According to some embodiments of the present invention, at least one of the blocks of light elements may comprise more than 128 light emitting elements.

According to some embodiments of the present invention, at least one of the blocks of light elements may comprise light-emitting elements aligned with substantially equal intervals, the block of light elements having a pitch between adjacent light-emitting elements of less than 35 microns.

The term "pitch" is to be understood as the average distance between the geometric centre of two adjacent light-emitting elements being part of one block of light elements, e.g. between adjacent LED's of a LED-array chip.

The blocks of light elements, e.g. LED array chips, may be chips of 600 dpi or even 1200 dpi. "dpi" means dots per inch, each dot being light-emitting element.

According to some embodiments of the present invention, the bulk material may be a sintered Al—Si alloy.

According to some embodiments of the present invention, the conductive adhesive, in particular the first conductive adhesive for physically attaching the blocks of light elements and the carrier structure, may be a silver filled epoxy resin based adhesive.

The silver filled epoxy resin based adhesive may be flexible after curing. The filling may be provided as silver power of short fibers provided from silver. Alternatively or additionally, other conductive fillers in fiber or powder form may be used. Such silver filled epoxy resin based adhesive may be used as the second conductive adhesive. However in some embodiments the second adhesive may be more flexible than an epoxy adhesive.

According to another aspect of the present invention, a method to provide a light emitting head is provided. The method comprises the steps of providing a rigid carrier structure provided from a bulk material, said carrier structure spanning at least the illuminated length of the head, said bulk material having a coefficient of thermal conduction larger than 100 W/mK and a coefficient of thermal expansion;

providing a plurality of blocks of light elements arranged in a longitudinal array, the blocks having a coefficient of thermal expansion, each of the blocks of light elements having a first and a second surface, each of said blocks of light elements comprising a plurality of light-emitting elements exposed on a first surface on said block, said bulk material having a coefficient of thermal expansion that differs from the thermal expansion coefficient of the block material by a maximum of $5*10^{-6}$/K;

physically attaching said plurality of blocks to said carrier structure by a conductive adhesive at the second surfaces.

Optionally the plurality of blocks may be physically attached to the carrier structure by a conductive adhesive at a substantial part of the second surfaces of the blocks of light elements. Optionally the adhesive may be applied to substantially the entire second surfaces of the blocks of light elements.

According to some embodiments of the present invention, the physically attaching of a block to the carrier structure may comprise applying the conductive adhesive at the second surface of the block and curing the conductive adhesive at temperatures less than 60° thereby attaching the block to the carrier structure. Optionally curing temperatures of less than 40° C. are used. The conductive adhesive is in particular thermally conductive adhesive, and optionally also electrically conductive. Optionally the plurality of blocks may be physically attached to the carrier structure by a conductive adhesive at a substantial part of the second surfaces of the blocks of light elements. Optionally, the adhesive may be applied to substantially the entire second surfaces of the blocks of light elements.

According to some embodiments of the present invention, the step of physically attaching may comprise die-bonding of said plurality of blocks to said carrier structure.

According to some embodiments of the present invention, the carrier structure may be a carrier bar. The method further may comprise the steps of providing a metallic base structure spanning at least the print width of the light emitting head, the base structure being provided with cooling means, physically attaching the carrier bar to said metallic base support by a flexible layer of conductive adhesive.

The conductive adhesive is in particular thermally conductive, and optionally electrically conductive.

The method according to the fourth aspect of the present invention has the advantage that a light emitting head, e.g. an LED array head, may be provided which has blocks of light elements being provided on the carrier structure with improved precision.

According to some embodiments of the present invention, a light emitting head, optionally being a LED array head, may comprise a carrier structure, such as a rigid and/or elongate carrier structure, comprising or consisting of a bulk material having a longitudinal spanning at least the print width of the light emitting head, optionally being a LED array head, with a coefficient of thermal expansion and a coefficient of thermal conduction larger than 100 W/mK;

a plurality of blocks of light elements, optionally being LED array chips, wherein each of said blocks of light elements, optionally being LED array chips, has a plurality of light-emitting elements aligned and exposed on an upper surface thereof, said plurality of blocks of light elements, optionally being LED array chips, being aligned on the carrier structure in the longitudinal direction (in which optionally the light-emitting elements are aligned with equal intervals), and the lower surface of said plurality of blocks of light elements, optionally being LED array chips, is physically attached to the carrier structure by a conductive adhesive, the bulk material having a coefficient of thermal expansion that differs from the thermal expansion coefficient of the block material by a maximum of $5*10^{-6}$/K, e.g. by $4*10^{-6}$/K; or $<4*10^{-6}$/K, e.g. $<3*10^{-6}$/K such as $1.1*10^{-6}$/K.

Optionally the plurality of blocks may be physically attached to the carrier structure by a conductive adhesive at a substantial part of the second or "lower" surfaces of the blocks of light elements. Optionally the adhesive may be applied to substantially the entire second surfaces of the blocks of light elements. The coefficient of thermal expansion of the bulk material may be in the range of $5*10^{-6}$/K to $9*10^{-6}$/K.

The adhesive is in particular thermally conductive adhesive. The adhesive is optionally electrically conductive as well. The blocks of light elements, optionally being LED array chips, may include a semiconductor compound having gallium arsenide therein, such as AlGaAs.

According to some embodiments of the present invention, a light emitting head, optionally being an LED array head, may comprise
- a metallic base structure spanning at least the print width of the light emitting head, optionally being a LED array head, and provided with cooling means;
- an intermediate carrier bar spanning at least the print width of the blocks of light elements, optionally being a LED array head consisting of a bulk material with a coefficient of thermal expansion and a coefficient of thermal conduction larger than 100 W/mK;
- a plurality of blocks of light elements, optionally being LED array chips wherein each of said blocks of light elements, optionally being LED array chips, has a plurality of light-emitting elements aligned and exposed on an upper surface thereof, said plurality of blocks of light elements, optionally being LED array chips are aligned on said intermediate carrier bar in a direction in which said light-emitting elements are aligned with equal intervals, and the lower surfaces of said plurality of blocks of light elements, optionally being LED array chips, are physically attached to said carrier bar by a conductive adhesive, the bulk material having a coefficient of thermal expansion that differs from the thermal expansion coefficient of the block material by a maximum of $5*10^{-6}$/K, e.g. by $4*10^{-6}$/K; or $<4*10^{-6}$/K, e.g. $<3*10^{-6}$/K such as $1.1*10^{-6}$/K
wherein said carrier bar is physically attached to said metallic base support by an at least 100 micron thick layer of curable, second conductive adhesive that remains or becomes flexible after curing.

Optionally the plurality of blocks may be physically attached to the carrier structure by a conductive adhesive at a substantial part of the second or "lower" surfaces of the blocks of light elements. Optionally the adhesive may be applied to substantially the entire second surfaces of the blocks of light elements.

The chips may be made from a semiconductor compound, e.g. having gallium arsenide therein or compounds thereof, e.g. AlGaAs. The adhesive may be thermally conductive. Optionally, the adhesive may be electrically conductive.

The bulk material may have a coefficient of thermal expansion in the range of $5*10^{-6}$/K to $9*10^{-6}$/K. The adhesive is in particular a thermally conductive adhesive, optionally also electrically conductive.

According to some embodiments of the present invention, a light emitting head, optionally being a LED array head, may comprise
- a carrier structure consisting of a bulk material spanning at least the print width of the light emitting head, optionally being a LED array head, with a coefficient of thermal expansion in the range of $5*10^{-6}$/K to $9*10^{-6}$/K and a coefficient of thermal conduction larger than 100 W/mK
- a plurality of blocks of light elements, optionally being LED array chips, wherein each of said blocks of light elements, optionally being LED array chips, has a plurality of light-emitting elements aligned and exposed on an upper surface thereof and has a common electrode provided on a lower surface thereof, said plurality of blocks of light elements, optionally being LED array chips, are aligned on said carrier structure in a direction in which said light-emitting elements are aligned with equal intervals, and the lower surfaces of said plurality of blocks of light elements, optionally being LED array chips, are electrically connected through the common electrodes provided thereon to said carrier structure by an electrically conductive adhesive, the conductive adhesive additionally physically attaching the blocks of light elements, optionally being LED array chips, to said intermediate carrier structure, the bulk material having a coefficient of thermal expansion that differs from the thermal expansion coefficient of the block material by a maximum of $5*10^{-6}$/K, e.g. by $4*10^{-6}$/K; or $<4*10^{-6}$/K, e.g. $<3*10^{-6}$/K, such as $1.1*10^{-6}$/K.

The adhesive may be a thermally conductive adhesive. The coefficient of thermal expansion of the bulk material may be in the range of $5*10^{-6}$/K to $9*10^{-6}$/K.

Optionally the plurality of blocks may be physically attached to the carrier structure by a conductive adhesive at a substantial part of the second or "lower" surfaces of the blocks of light elements. Optionally the adhesive may be applied to substantially the entire second surfaces of the blocks of light elements.

According to some embodiments of the present invention, a light emitting head, optionally being a LED array head, may comprise
- a metallic base structure spanning at least the print width of the light emitting head, optionally being a LED array head, provided with cooling means;
- an intermediate carrier bar spanning at least the print width of the light emitting head, optionally being a LED array head, consisting of a bulk material with a coefficient of thermal expansion and a coefficient of thermal conduction larger than 100 W/mK
- a plurality of blocks of light elements, optionally being LED array chips, wherein each of said blocks of light elements, optionally being LED array chips, has a plurality of light-emitting elements aligned and exposed on an upper surface thereof and has a common electrode provided on a lower surface thereof, said plurality of blocks of light elements, optionally being LED array chips, are aligned on said intermediate carrier bar in a direction in which said light-emitting elements are aligned with equal intervals, and the lower surfaces of said plurality of blocks of light elements, optionally being LED array chips, are electrically connected through the common electrodes provided thereon to said intermediate carrier bar by a conductive adhesive, the conductive adhesive additionally physically attaching the blocks of light elements, optionally being LED array chips, to said intermediate carrier bar, the bulk material having a coefficient of thermal expansion that differs from the thermal expansion coefficient of the block material by a maximum of $5*10^{-6}/K$, e.g. by $4*10^{-6}/K$; or $<4*10^{-6}/K$, e.g., $<3*10^{-6}/K$, such as $1.1*10^{-6}/K$; wherein said intermediate carrier bar is physically attached to said metallic base support by an at least 100 micron thick layer of a second conductive adhesive that is flexible after curing.

Optionally the plurality of blocks may be physically attached to the carrier structure by a conductive adhesive at a substantial part of the second or "lower" surfaces of the blocks of light elements. Optionally the adhesive may be applied to substantially the entire second surfaces of the blocks of light elements. The adhesive may be a thermally conductive adhesive. The coefficient of thermal expansion of the bulk material may be in the range of $5*10^{-6}/K$ to $9*10^{-6}/K$.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The teachings of the present invention permit the design of improved electrophotographic printers, in which LED array head or LED array heads according to the present invention are used as light source for writing an electrostatic latent image on a photoconductive drum.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

In the different figures, the same reference signs refer to the same or analogous elements.

DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Similarly, it is to be noticed that the term "coupled", also used in the claims, should not be interpreted as being restricted to direct connections only. The terms "coupled" and "connected", along with their derivatives, may be used. It should be understood that these terms are not intended as synonyms for each other. Thus, the scope of the expression "a device A coupled to a device B" should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practised without these specific details. In other instances, well-known methods, structures and techniques have not been shown in detail in order not to obscure an understanding of this description.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

Reference is made to conductive adhesive, which is in particular thermally conductive. For some embodiments, the conductive adhesive will also be provided with electrically conductive properties, in particular in case a plurality of light-emitting elements are used having a common electrode provided on a lower surface thereof. The electrically conductive adhesive may electrically couple the plurality of light-emitting elements.

Figure 5A:
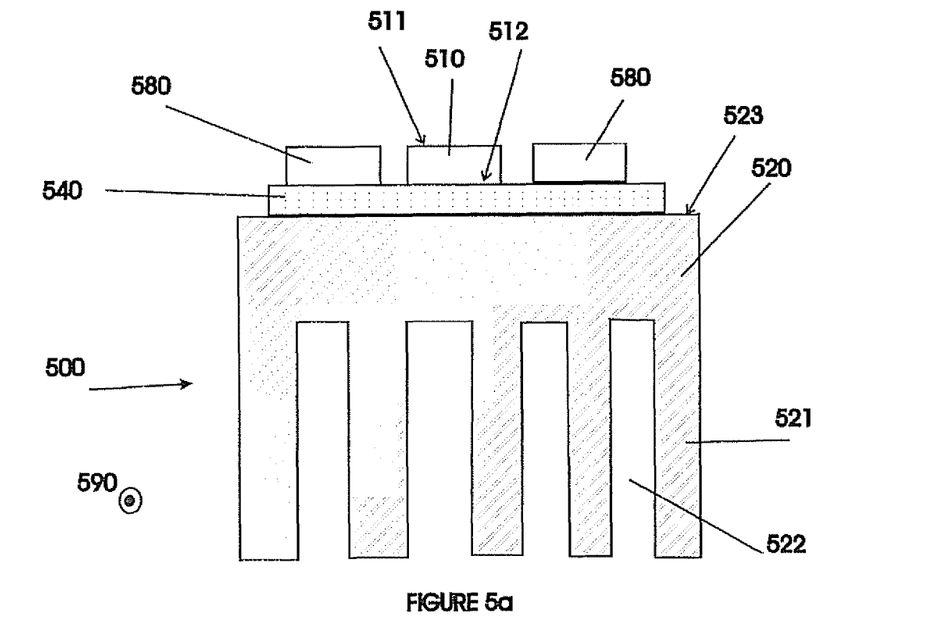
FIG. 5 schematically shows a first embodiment of a LED array head according to the present invention.

FIG. 5a shows a light emitting array, e.g. a light emitting head 500, in this particular embodiment an LED array head, having light emitting elements, being LED's. This array may be used in a printer or a copier, e.g. in an electrostatic printer or copier. The array may be for full-page printing or copying. In the following reference will be made to printheads but it should be understood that any array according to the present invention can be used for copiers as well.

The head 500 comprises a rigid, elongate carrier structure 520 made preferably in one piece from a bulk material whose thermal characteristics have preferably been selected to provide good thermal transfer and cooling of the light emitting elements. For example, the carrier structure may be in the form of fins, e.g. bonded plates 521 providing extensive surface area for air cooling and having optionally internal channels 522 for circulation of a coolant such as a cooling gas or liquid (see also FIG. 5b). The thermal characteristics of the bulk material can also be selected to provide a thermal expansion coefficient (CTE) in a range which reduces or eliminates the problems of prior art devices described above caused by mismatch of CTE.

Materials that can be used for the carrier structure include Cu—W alloys, metal matrix composites and Al—Si sintered alloys. As Cu—W alloys are heavy and expensive and lack stiffness, metal matrix composites and sintered Al—Si alloys are one preferred material. Al—Si alloys can be obtained from e.g. RSP technology in Delfzijl, the Netherlands. Al—Si materials have the additional advantage that they can be machined and have lower specific gravity.

Good heat transport of the bulk material allows adequate temperature control resulting in uniform temperature across the printing width as was found with an Led Array head test set-up with a wiring substrate in the form of a rigid carrier structure 520 of sintered Si-30% Al alloy with a Coefficient of Thermal Expansion (CTE) in the range of $5*10^{-6}$/K to $9*10^{-6}$/K, e.g. a value of $7\ 10^{-6}\ K^{-1}$ and a Coefficient of Thermal Conduction of at least 100 W/mK, e.g. 170 W/mK, as shown in FIG. 5a. The rigid carrier structure 520 is assembled from sintered Al—Si alloy plates which act as a heat sink shaped with cooling fins for air cooling.

Figure 5B:
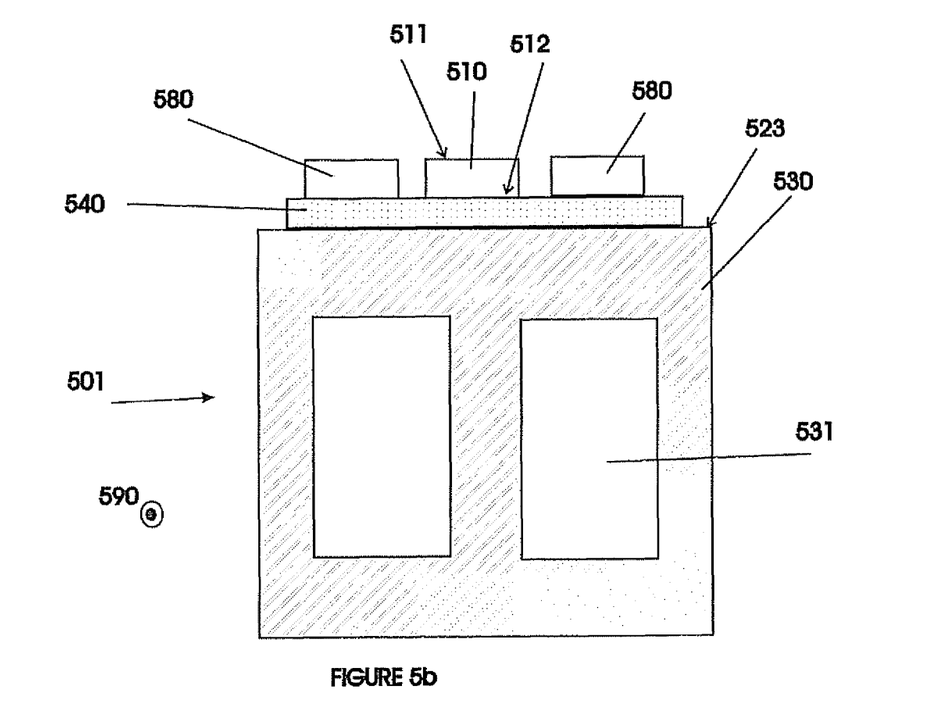

A further alternative LED array head 501 is shown in FIG. 5b, where identical or equivalent materials are used for the parts of the LED array head. The rigid carrier structure 530, being provided from the same bulk material as for carrier structure 520, and also preferably in one piece and comprises a cooling means being one or more channels 531 for circulating an actively cooled fluid such as a liquid or gas. The channels may be in the form of heat pipes.

The light emitting head 500 comprises a plurality of blocks of light elements 510, being LED array chips. Instead of LED's, other light emitting devices can be used such as Laser diodes, for example VCSEL's. The LED array chips 510 include a compound semiconductor, e.g. based on gallium arsenide. Each of the LED array chips 510 is in the form of a block with a plurality of light-emitting elements aligned and exposed on an upper surface 511 thereof. The LED array chips 510 are aligned on the rigid carrier structure 520 respectively 530, being the wiring substrate. The LED array chips are aligned in a direction 590 in which said light-emitting elements are aligned with equal intervals non the upper surface of the LED array chip. This direction is also the direction of the print width, i.e. the longitudinal direction of the elongate printhead.

LED array chips 510 used can be AlxGa1-xAs epitaxial heterostructures. This type of LED array chips are described in "High speed 1200 dpi print head" by Ogihara et. al. in Proceedings of the Pan Pacific Imaging Conference/Japan Hardcopy 1998, pp. 257-260, 1998 these LED array chip 510 are designs with a common cathode design and typically have this common electrode provided on a lower surface 512 of the LED array chip 510.

Conductive adhesives 540 suitable for bonding the LED-chips directly and physically to the rigid carrier substrate 520 respectively 530 include epoxy-based adhesives. These may be thermally conductive and/or electrically conductive, e.g. depending upon the type of filler. For good thermal conduction, the adhesive 540 can be filled with small metal particles that can also improve the electrical conduction. Alternative adhesives can be bismaleimide-based, butadiene-based, acrylate-based or silicone-based. One such metal filling is silver particles.

Adhesives that are soft after curing have additional benefits in stress relief and they facilitate the mechanical removal of driver-chips 580 or LED-chips in view of repairs. Adhesives that are soft after curing are preferred. Adhesives that are resilient after curing can be advantageous.

Flexible epoxy resin suitable for bonding the LED array chips 510 to the rigid carrier structure 520 or 530, being the wiring substrate, can include, for example, dimer acid diglycidyl ester (manufactured by Shell chemical Co. and sold under trade name of Epikote 871, 872), bisphenol side chain type epoxy resin (manufactured by ASAHI DENKA KOGYO and sold under trade name of ADEKA resin EP 4000), and polyoxyalkylene glicol_diglycidyl ether (DER 732, 736 manufactured by the Dow Chemical Company).

The flexible curing agent includes polyamide of dimer acid and superfluous diamine, EH631 and EH651, Epomate (manufactured by Ajinomoto), and dodecenyl succinic anhydride.

The flexibilizer for acid anhydride curing includes polyester and polyoxyalkyleneglicol having hydroxyl group at the ends thereof and the flexible curing agent for amine setting includes polysulfide (e.g., Thiokol LP-3) having a thiol group.

Other agents that serve both as a flexibilizer and a reactive diluent include glycidyl ester of tertiary fatty acid glycidyl ester (manufactured by Shell Chemical Company) and glycidyl ether of alkylphenol.

For LED array chips 510 that are electrically connected through the common electrodes a thermally and electrically conductive adhesive 540 can be used to physically and directly attach, e.g. the thermally and electrically conductive adhesive 540 electrically connects the LED array chips 510 to a conductive circuit of the wiring substrate being the rigid carrier structure 520 by the electrically conductive epoxy resin-type adhesive 540 that becomes flexible after curing. The thermally and electrically conductive epoxy resin-type adhesive additionally physically attaching the LED array chips to the wiring substrate being the carrier structure 520. As the volume electrical resistivity of a preferred silver filled soft conductive adhesive 540 was found to be below 50 $10^{-6}$ Ohm·m, LED array chips 510 being electrically connected through the common electrodes may be used in combination with this electrically conductive adhesive 540.

Thermal conductivity of the preferred silver filled soft conductive adhesive 540 was confirmed to be above 1.5 W/mK.

An alternative embodiment of the current invention for common electrode LED's can be realized with multiple cathode LED array chip design where cathode contacts for groups of LED's are provided in the form of bonding pads as discussed in "LED print head for Use in High-speed, High Image Quality Color Printer" by Koizumi et. Al. and published as OKI Technical Review 189 April 2002 pp 38-43—available from http://www.oki.com. In that case the adhesive bonding to the substrate is only to provide thermal contact and there is no LED current through the adhesive. The adhesive 540 can then be thermally conductive, but not necessarily electrically conductive.

In combination with common electrode LED array chips 510, where the cathode contact is made through the electrically conductive adhesive 540 bond and the LED current flows through the carrier structure 520, it has been found advantageous to coat the surface 523 of the carrier structure 520 with a noble metal such as Au to improve current injection and to reduce voltage drops across the interface of the carrier structure 520 and the adhesive 540. Good results are obtained for carrier structures being Al—Si sintered alloys with electrical volume resistivity for the bulk material of about 340 $10^{-9}$ Ohm·m.

Figure 6:
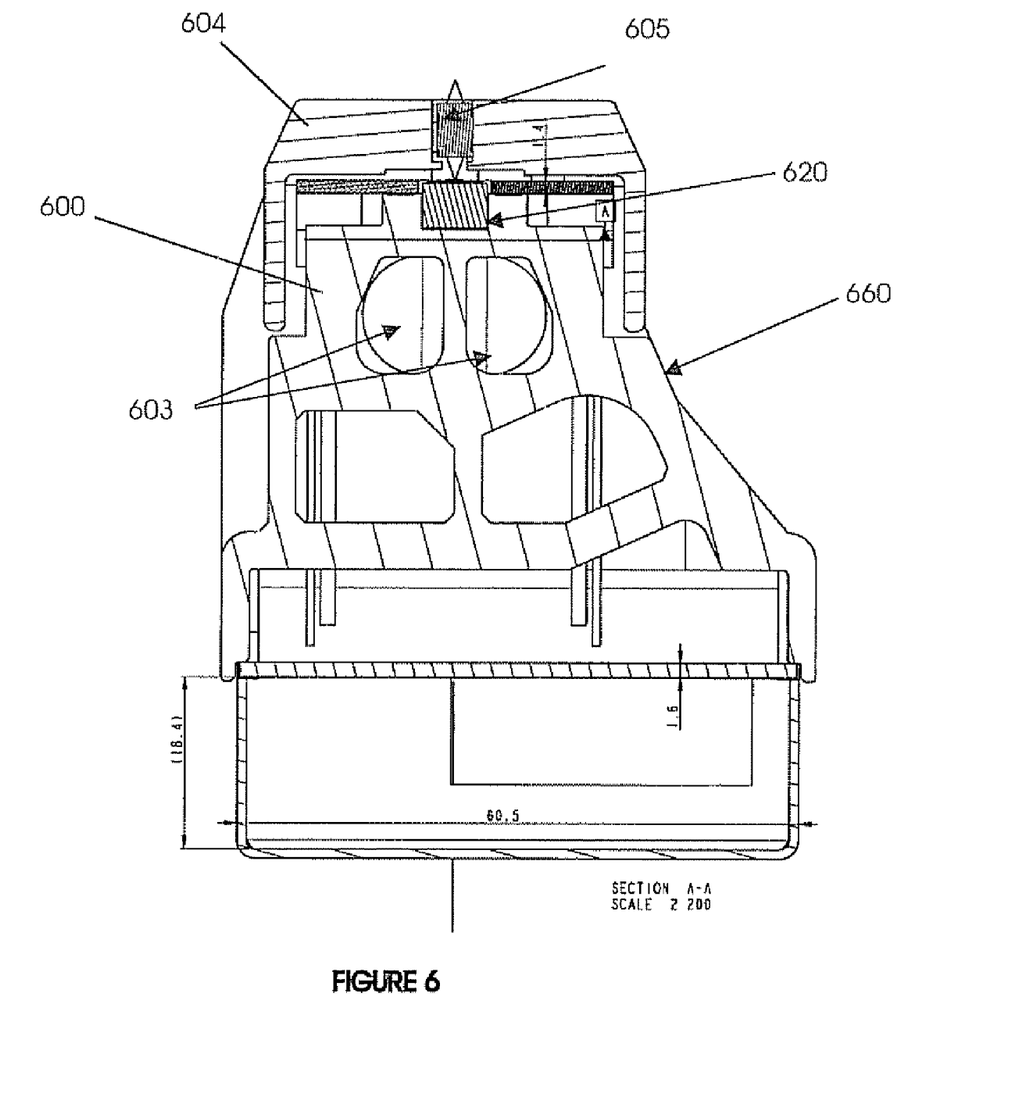
FIG. 6 schematically shows a second embodiment of a LED array head according to the present invention.
Figure 7:
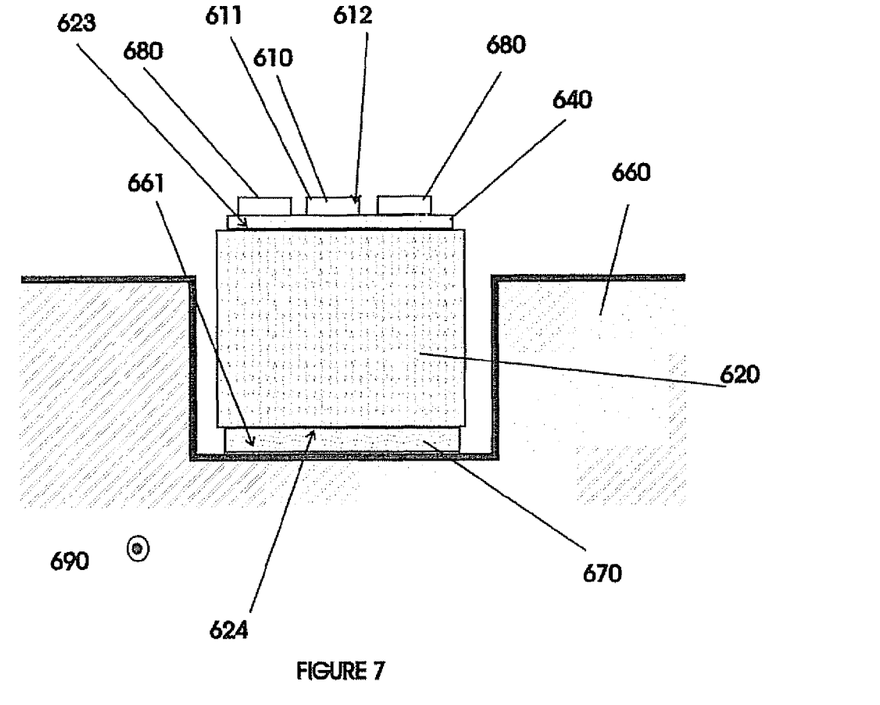
FIG. 7 shows a detail of the embodiment of FIG. 6.

A mechanically more robust LED array head 600, which is in particular suitable for printing widths exceeding 270 mm, has a separate metallic base structure 660 in addition to a carrier structure, which is hereafter referred to as intermediate carrier bar 620 FIG. 6 shows a general view on LED array head 600, FIG. 7 shows a detailed view of the base structure 660 and the carrier bar 620. This embodiment has the advantage that the metallic base structure 660 can de made from an extrusion of a light metal, such as Al, with pre-formed cooling channels, such as two or four cooling channels 603 integrated in the base structure 660. As shown in FIG. 6, a rod lens array 605, held by an optics holder 604 can be mounted above the carrier bar 620 to focus the light from the light emitting elements, e.g. onto a light sensitive semiconductor surface such as a printing drum.

Similar to the carrier structure 520 of the embodiment shown in FIG. 5, the carrier bar 620 may be made from a bulk material having a Coefficient of Thermal Expansion (CTE) in the range $5*10^{-6}$/K to $9*10^{-6}$/K; e.g. a value of 7 $10^{-6}$ $K^{-1}$ and a Coefficient of Thermal Conduction (CTC) of at least 100 W/mK such as 170 W/mK, e.g. made from a sintered Si-30% Al alloy. The carrier bar 620 is physically attached to the metallic base support 660 by an at least 100 micron thick layer of thermally conductive adhesive 670, e.g. epoxy- or silicone resin-type adhesive that is flexible after curing. As the carrier bar 620 and the metallic base structure 660 have different CTE's, the relatively thick layer of adhesive 670, e.g. soft adhesive optionally resilient adhesive, can accommodate the relative expansion/contraction such that both the carrier bar 620 and the metallic base structures 660 remain substantially straight under changing temperatures.

Though not excluded, for LED array heads with a print width exceeding 270 mm it was found that a thickness of the preferably soft, thermally and optionally conductive adhesive layers 670 may be in the range from 200 to 500 micron. For most applications, a thickness of the soft conductive adhesive layers of less than 100 micron was found less favored to accommodate the relative expansion/contraction, since in particular circumstances, still failures might occur.

The thick elastic bond can be made of a variety of optionally soft, thermally and optionally electrically conductive adhesives. Good results were obtained with single component silver paste RTV silicones with volume electrical resistivity around 45 $10^{-6}$ Ohm·m Using common electrode LED array chips 610 where the cathode contact is made through the first adhesive 640, being electrically conductive adhesive (which physically and directly attaches), the carrier bar 620, the second adhesive 670 being electrically conductive adhesive and the base structure 660 comprising cooling means, it was found advantageous to coat or plate the carrier bar on both the upper and lower surface 623 respectively 624 with a noble metal such as gold. For cooling substrates made of materials such as Al that form native oxide surface layers best results were obtained when an inert metal coating is provided on at least the surface 661 engaged in the adhesive 670.

One aspect of the present invention relates to the use of different types of adhesives at different positions of the structure forming the light emitting array. The use of support material with a better match of CTE with respect an adhesive to the light emitting blocks does not necessarily solve the CTE mismatch problem but simply moves it from the block/carrier interface to the carrier/support interface. If a rigid adhesive is used to join two materials together of differing CTE, the combination van behave somewhat like a bimetallic strip. Distortions and bending with changes in temperature art not advantageous for high resolution printers or copiers. Hence, in accordance with this aspect of the invention the rigidity of the adhesive used is selected based on the different in CTE. If the GTE difference is small; the mechanical stresses induced by temperature change are low and hence a more rigid adhesive can be used. A more rigid adhesive can have the advantage that the light emitting blocks are securely held. On the other hand where the CTE difference is large, a softer adhesive is preferred, e.g. with a lower modulus. Thus, the present invention includes a mulitlayer structure whereby the CTE difference between the light emitting blocks and the first layer of the support structure, e.g. the carrier is kept low and the adhesive used has a higher modulus, whereas layers of the structure further away from the light emitting blocks can have larger differences in GTE with respect to each other and the adhesive used can have a lower modulus. The first conductive adhesive may have an elasticity modulus of more than 1000 MPa, e.g. being an epoxy-type adhesive or an acrylate-based adhesive, whereas the second conductive adhesive, for coupling the base structure and the carrier bar, has optionally a lower elasticity modulus, e.g. an elasticity modulus of less than 10 MPa, such as silicone-based adhesives or butadiene based adhesives, e.g. adhesives having an elasticity modulus of a about 1 Mpa. Optionally the second conductive adhesive is a silicon-based adhesive provided with a layer thickness of 100 to 500 µm thickness.

The use of cooling channels with an actively pumped and temperature controlled liquid has the additional advantage that the LED array heads used for the different image forming stations of a multicolour printer are thermally coupled to the same reference temperature. This will help in eliminating registration errors in between the colours as differential thermal expansion between the different LED array heads can be reduced significantly.

Though in FIG. 6 and FIG. 7, a substantially rectangular cross section of a carrier bar 620 is shown, the cross section being made according to a plane perpendicular to the printing with direction 690, it is understood that also other cross sections may be used.

It is understood that the same or identical materials may be used for the provision of the rigid carrier bar 620, as is the case for the rigid carrier structures 520 and/or 530 used in the embodiments shown in FIG. 5, and having the same advantages. Rigid carrier bar 620 can be made of one piece.

It is understood that the same or identical LED array chips 610 having a first and second surface 611 respectively 612 may be used and having the same advantages, as is the case for LED array chips 510 or having a first and second surface 511 respectively 512 used in the embodiments shown in FIG. 5.

Similarly, the adhesive 640 of the embodiments of FIG. 6 and FIG. 7 may be similar or even identical to the adhesive 540 of the embodiments of FIG. 5, having the same or similar advantages, e.g. of physically and directly attaching.

Figure 8:
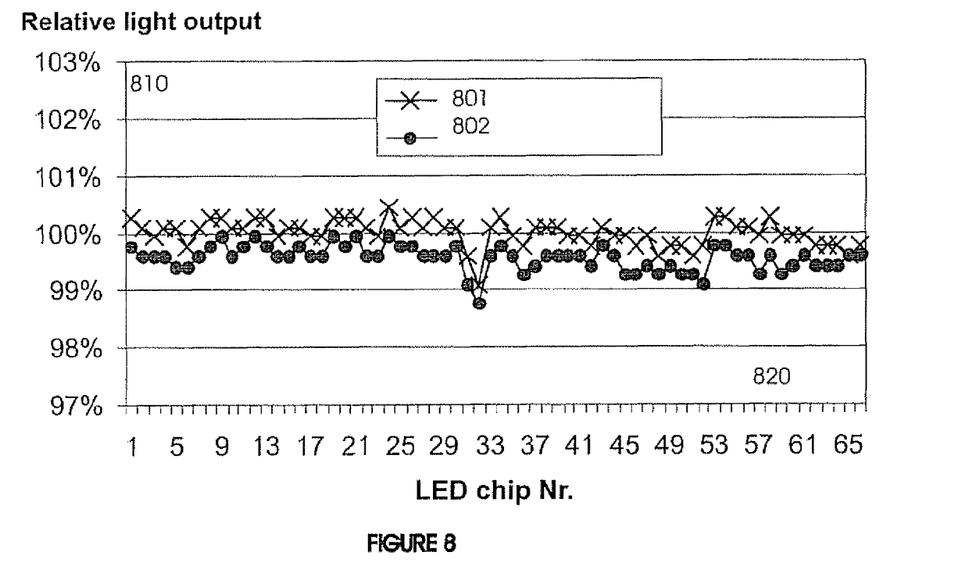
FIG. 8 are results of a light output measurements for an embodiment of the LED array head as shown in FIG. 6 and FIG. 7

Similarly, the driver chips 680 of the embodiments of FIG. 6 and FIG. 7 may be similar or even identical to the driver chips 580 of the embodiments of FIG. 5, having the same or similar advantages FIG. 8 shows experimental data demonstrating the capabilities of LED array heads according to the present invention.

The light output of one LED array chip mounted on a carrier bar, which carrier bar is mounted in on a base structure according to the embodiment of FIG. 6 and FIG. 7 is measured.

Data points represent light output (in ordinate 810) measurements made in the image plane of the rod lens array in the middle of the projected image corresponding to each of the 66 LED's of the LED array Chip. The abscissa 820 represents the LED array chip number, numbered in the order as they are aligned on the LED array head in printing width direction.

The data points 801, being crosses, represent the light output of each LED array chip (numbered 1 to 66 in the order as they are aligned on the LED array head in printing width direction) taken when the particular single LED array chip (referenced by its number) is provided with a pulsed current of 300 microamperes simultaneously on each of its 384 LED's (total current 115 mA). Plotted values are expressed as a percentage compared to the average over the entire array (average of the crosses 801).

The data points 802, being filled circles, represent the same type of measurement (relative to the average of the curve with the data points 801) when all of the 66 LED array chips are provided with a current of 300 microamperes on each of their 384 LED's (total current 7.6 A).

It can be observed that the light outputs of the LED array chips are substantially within 1% deviation of the average, which indicates that the electrical conduction through the first adhesive 640, the carrier bar 620, the second adhesive 670 and the base structure 660 is fully acceptable for a high quality LED array head printing system.

Additional measurement of the light output of a single LED after full exposure on the complete LED for 10 minutes, compared to the same measurements after a long idle time show a 2% light output decrease consistent with a local temperature increase of 4 degrees. This local temperature increase that may be due to local heating that is not completely flattened out is found to be restores in a few seconds. This result is fully in line with the requirements of high quality multilevel printing.

Other arrangements for accomplishing the objectives of the LED array heads embodying the invention will be obvious for those skilled in the art.

The LED array heads according to the present invention may be used as a light source for writing an electrostatic latent image on a photoconductive drum in an electrophotographic printer. In case the printer is a multicolour printer, the LED array heads, when comprising cooling means using cooling fluid to cool the LED array heads, may be thermally coupled by means of the cooling fluid used in the cooling circuit, providing cooling fluid to each of the LED array heads.

It is to be understood that although preferred embodiments, specific constructions and configurations, as well as materials, have been discussed herein for devices according to the present invention, various changes or modifications in form and detail may be made without departing from the scope of this invention as defined by the appended claims. For example, any formulas given above are merely representative of procedures that may be used.

The invention claimed is:

1. A light emitting head for use in copiers or printers, the light emitting head having an illuminated length constituting a print width or copy width, comprising:
   a rigid carrier structure of one piece and provided from a bulk material, said carrier structure spanning at least the illuminated length of the head, said bulk material having a coefficient of thermal conduction larger than 100 W/mK and a coefficient of thermal expansion;
   a plurality of blocks of light elements arranged in a longitudinal array, the blocks having a coefficient of thermal expansion, each of the blocks of light elements having a first and a second surface, each of said blocks of light elements comprising a plurality of light-emitting elements exposed on a first surface on said block, said plurality of blocks being physically directly attached to said carrier structure by a conductive adhesive at the second surfaces,
   wherein the blocks of light elements are LED array chips,
   wherein said bulk material has a coefficient of thermal expansion that differs from the thermal expansion coefficient of the block material by a maximum of $5*10^{-6}$/K.

2. The light emitting head according to claim 1, wherein the conductive adhesive is provided at least at a substantial part of the second surface.

3. The light emitting head according to claim 1, wherein the conductive adhesive has a thermal conductivity in the range >0.5 W/mK.

4. The light emitting head according to claim 1, wherein the bulk material has a coefficient of thermal expansion that differs from the thermal expansion coefficient of the block material by a maximum of ±30%.

5. The light emitting head according to claim 1, wherein the bulk material has a coefficient of thermal expansion in the range of $5*10^{-6}$/K to $9*10^{-6}$/K.

6. The light emitting head according to claim 1, wherein each of said blocks of light elements has a common electrode provided on a lower surface of said block of light elements.

7. The light emitting head according to claim 1, wherein said carrier structure is a carrier bar.

8. The light emitting head according to claim 7, wherein said light emitting head further comprises a metallic base structure spanning at least the print width of the light emitting head, and the carrier bar is physically attached to said metallic base support by a flexible layer of a second conductive adhesive.

9. The light emitting head according to claim 8, wherein said second conductive adhesive has an elasticity modulus that is less than the elasticity modulus of the conductive adhesive physically attaching said plurality of blocks to said carrier structure.

10. The light emitting head according to claim 8, wherein said metallic base structure comprises a cooling means.

11. The light emitting head according to claim 10, wherein said cooling means comprises one or more channels for circulating cooled liquid.

12. The light emitting head according to claim 1, wherein at least one surface of said carrier structure meant for contacting the conductive adhesive is provided with a coating of a metal selected from the group consisting of silver, gold, platinum, copper, mercury, aluminium, palladium, rhodium, iridium, and osmium, or a combination of metals from this group.

13. The light emitting head according to claim 1, wherein at least one of said blocks of light elements comprises more than 128 light emitting elements.

14. The light emitting head according to claim 1, wherein at least one of said blocks of light elements comprises light-emitting elements aligned at substantially equal intervals, the block of light elements having a pitch between adjacent light-emitting elements of less than 35 microns.

15. The light emitting head according to claim 1, wherein said bulk material is a sintered Al—Si alloy.

16. The light emitting head according to claim 1, wherein the conductive adhesive physically attaching said plurality of blocks to said carrier structure is a silver filled epoxy resin based adhesive.

17. A light emitting head for use in copiers or printers, the light emitting head having an illuminated length constituting a print width or copy width, comprising:
a rigid carrier structure of one piece and provided from a bulk material, said carrier structure spanning at least the illuminated length of the head, said bulk material having a coefficient of thermal conduction larger than 100 W/mK and a coefficient of thermal expansion;
a plurality of blocks of light elements arranged in a longitudinal array, the blocks having a coefficient of thermal expansion, each of the blocks of light elements having a first and a second surface, each of said blocks of light elements comprising a plurality of light-emitting elements exposed on a first surface on said block, said plurality of blocks being physically directly attached to said carrier structure by a conductive adhesive at the second surfaces,
wherein the blocks of light elements are selected from LED array chips, laser diode arrays, and VSCEL arrays,
wherein said bulk material has a coefficient of thermal expansion that differs from the thermal expansion coefficient of the block material by a maximum of $5*10^{-6}$/K.

18. The light emitting head according to claim 17, wherein the conductive adhesive is provided at least at a substantial part of the second surface.

19. The light emitting head according to claim 17, wherein the conductive adhesive has a thermal conductivity in the range >0.5 W/mK.

20. The light emitting head according to claim 17, wherein the bulk material has a coefficient of thermal expansion that differs from the thermal expansion coefficient of the block material by a maximum of ±30%.

21. The light emitting head according to claim 17, wherein the bulk material has a coefficient of thermal expansion in the range of $5*10^{-6}$/K to $9*10^{-6}$/K.

22. The light emitting head according to claim 17, wherein each of said blocks of light elements has a common electrode provided on a lower surface of said block of light elements.

23. The light emitting head according to claim 17, wherein said carrier structure is a carrier bar.

24. The light emitting head according to claim 23, wherein said light emitting head further comprises a metallic base structure spanning at least the print width of the light emitting head, and the carrier bar is physically attached to said metallic base support by a flexible layer of a second conductive adhesive.

25. The light emitting head according to claim 24, wherein said second conductive adhesive has an elasticity modulus that is less than the elasticity modulus of the conductive adhesive physically attaching said plurality of blocks to said carrier structure.

26. The light emitting head according to claim 24, wherein said metallic base structure comprises a cooling means.

27. The light emitting head according to claim 26, wherein said cooling means comprises one or more channels for circulating cooled liquid.

28. The light emitting head according to claim 17, wherein at least one surface of said carrier structure meant for contacting the conductive adhesive is provided with a coating of a metal selected from the group consisting of silver, gold, platinum, copper, mercury, aluminium, palladium, rhodium, iridium, and osmium, or a combination of metals from this group.

29. The light emitting head according to claim 17, wherein at least one of said blocks of light elements comprises more than 128 light emitting elements.

30. The light emitting head according to claim 17, wherein at least one of said blocks of light elements comprises light-emitting elements aligned at substantially equal intervals, the block of light elements having a pitch between adjacent light-emitting elements of less than 35 microns.

31. The light emitting head according to claim 17, wherein said bulk material is a sintered Al—Si alloy.

32. The light emitting head according to claim 17, wherein the conductive adhesive physically attaching said plurality of blocks to said carrier structure is a silver filled epoxy resin based adhesive.

* * * * *